United States Patent
Swaminathan et al.

(10) Patent No.: US 9,603,247 B2
(45) Date of Patent: Mar. 21, 2017

(54) ELECTRONIC PACKAGE WITH NARROW-FACTOR VIA INCLUDING FINISH LAYER

(71) Applicant: Intel Corporation, Santa Clara, CA (US)

(72) Inventors: Rajasekaran Swaminathan, Tempe, AZ (US); Sairam Agraharam, Phoenix, AZ (US); Amruthavalli Pallavi Alur, Tempe, AZ (US); Ram Viswanath, Phoenix, AZ (US); Wei-Lun Kane Jen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/456,606

(22) Filed: Aug. 11, 2014

(65) Prior Publication Data
US 2016/0044786 A1   Feb. 11, 2016

(51) Int. Cl.
*H05K 1/09*   (2006.01)
*H05K 1/11*   (2006.01)
(Continued)

(52) U.S. Cl.
CPC .............. *H05K 1/112* (2013.01); *H01L 24/13* (2013.01); *H01L 24/81* (2013.01); *H05K 1/09* (2013.01);
(Continued)

(58) Field of Classification Search
CPC ..................................................... H05K 3/243
(Continued)

(56) References Cited

U.S. PATENT DOCUMENTS

| 1,189,760 A | 7/1916 | Weiskopf |
| 6,192,581 B1 * | 2/2001 | Tsukamoto ......... H01L 23/3107 257/E21.509 |

(Continued)

FOREIGN PATENT DOCUMENTS

| CN | 105374780 A | 3/2016 |
| DE | 102015111191 A1 | 2/2016 |

(Continued)

OTHER PUBLICATIONS

"Korean Application Serial No. 10-2015-0097191, Office Action mailed Apr. 6, 2016", w/ English Translation, 9 pgs.

(Continued)

*Primary Examiner* — David Vu
*Assistant Examiner* — Brandon Fox
(74) *Attorney, Agent, or Firm* — Schwegman Lundberg & Woessner, P.A.

(57) ABSTRACT

This disclosure relates generally to an electronic package and methods that include an electrically conductive pad, a package insulator layer including a substantially non-conductive material, the package insulator layer being substantially planar, and a via. The via may be formed within the package insulator layer and electrically coupled to the electrically conductive pad. The via may include a conductor extending vertically through at least part of the package insulator layer and having a first end proximate the electrically conductive pad and a second end opposite the first end and a finish layer secured to the second end of the conductor, the finish layer including a gold compound.

18 Claims, 5 Drawing Sheets

(51) Int. Cl.
*H05K 3/24* (2006.01)
*H01L 23/00* (2006.01)
*H05K 3/40* (2006.01)

(52) U.S. Cl.
CPC ............. *H05K 3/243* (2013.01); *H05K 3/244* (2013.01); *H05K 3/4046* (2013.01); *H01L 2224/16165* (2013.01); *H01L 2224/16501* (2013.01); *H05K 2201/10189* (2013.01)

(58) Field of Classification Search
USPC ................... 257/774; 174/251, 257; 361/767
See application file for complete search history.

(56) References Cited

U.S. PATENT DOCUMENTS

| | | | | |
|---|---|---|---|---|
| 8,304,878 | B2* | 11/2012 | Appelt | H01L 21/563 257/686 |
| 2006/0094236 | A1 | 5/2006 | Elkins et al. | |
| 2008/0298038 | A1 | 12/2008 | Kaneko | |
| 2009/0166858 | A1* | 7/2009 | Bchir | H01L 23/49811 257/737 |
| 2009/0314519 | A1* | 12/2009 | Soto | H01L 21/4857 174/250 |
| 2010/0096171 | A1* | 4/2010 | Lee | H05K 3/3484 174/257 |
| 2010/0327424 | A1* | 12/2010 | Braunisch | H01L 23/13 257/692 |
| 2011/0042128 | A1* | 2/2011 | Hsu | H05K 3/4007 174/257 |
| 2011/0175215 | A1 | 7/2011 | Farooq et al. | |
| 2012/0220056 | A1* | 8/2012 | Shi | H01L 23/13 438/3 |
| 2013/0168132 | A1* | 7/2013 | Lee | H05K 3/00 174/250 |
| 2013/0180766 | A1* | 7/2013 | Lee | H05K 3/3463 174/255 |
| 2014/0138825 | A1 | 5/2014 | Liu | |

FOREIGN PATENT DOCUMENTS

| | | |
|---|---|---|
| EP | 851724 A2 | 7/1998 |
| GB | 2530152 A | 3/2016 |
| JP | 1117300 A | 1/1999 |
| JP | 2011222553 A | 11/2011 |
| JP | 2015126342 A | 7/2015 |
| KR | 1020100043591 A | 4/2010 |
| KR | 1020130096281 A | 8/2013 |
| KR | 1020160019355 A | 2/2016 |
| TW | 201618249 A | 5/2016 |
| WO | WO-2009119680 A1 | 10/2009 |

OTHER PUBLICATIONS

"Korean Application Serial No. 10-2015-0097191, Response filed Jun. 13, 2016 to Office Action mailed Apr. 6, 2016", w/ English Claims, 21 pgs.

"United Kingdom Application Serial No. 1512070.2, Substantive Examination Report mailed Jan. 12, 2016", 8 pgs.

"Japanese Application Serial No. 2015-126342, Office Action mailed Jul. 5, 2016", With English Translation, 5 pgs.

"Korean Application Serial No. 10-2015-0097191, Office Action mailed Aug. 23, 2016", With English Translation, 5 pgs.

"Taiwanese Application Serial No. 104121860, Office Action ailed Jun. 1, 2016", W/ English Translation, 17 pgs.

"United Kingdom Application Serial No. 1512070.2, Office Action mailed Aug. 18, 2016", 5 pgs.

* cited by examiner

ELECTRONIC PACKAGE WITH NARROW-FACTOR VIA INCLUDING FINISH LAYER

TECHNICAL FIELD

The disclosure herein relates generally to electronic packages with vias and methods therefor.

BACKGROUND

Electronic packages, such as circuit boards and chip packages, often include a silicon die with input/output pads. Those pads may be soldered to other pads on a dielectric board. The pads on the board may be coupled to conductors within the board which may transmit electrical signals to and from the die, allowing for electrical connectivity between the silicon die and other devices by way of the board. Boards conventionally include multiple layers of conductors and other materials, such as ground planes, and the like. Vias may extend through the board to couple one layer to another.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Embedded bridge architecture may result in vias that are of such a size that, when the vias get relatively tall, such as by extending through multiple layers of the dielectric, the vias may induce relatively large amounts of stress on the pads. Such stress may result in cracking or delamination, such as on the pad or in the via. Additionally, relatively large vias may consume more material, such as copper, and may take up a larger footprint in the board, thereby increasing costs.

An architecture has been developed that may reduce via size while maintaining conventional via performance. Further, relative to conventional vias, the vias may consume less copper or other materials, may reduce solder bump cracking, may reduce via delamination, and may maintain first level interconnect (FLI) collapse. Unlike a conventional via, the via architecture is formed within a package insulator layer of the board and includes a conductor and a finish layer. The conductor extends vertically through at least some of the package insulator layer. In an example, the finish layer is secured to the conductor and includes a palladium-gold compound. In various alternative examples, the finish layer includes any of a variety of gold-based combinations, such as electroless nickel immersion gold (ENIG), ENIG plus electroless gold (ENIG+EG), and Nickel-Palladium-Gold (NiPdAu). Additionally or alternatively, the finish layer may include or may be an organic solderabiliy preservative (OSP). As a result of the architecture, the via may be smaller than conventional vias, thereby reducing stress on the pads and improving reliability and, in various examples, reducing materials used, thereby reducing costs.

Figure 1:
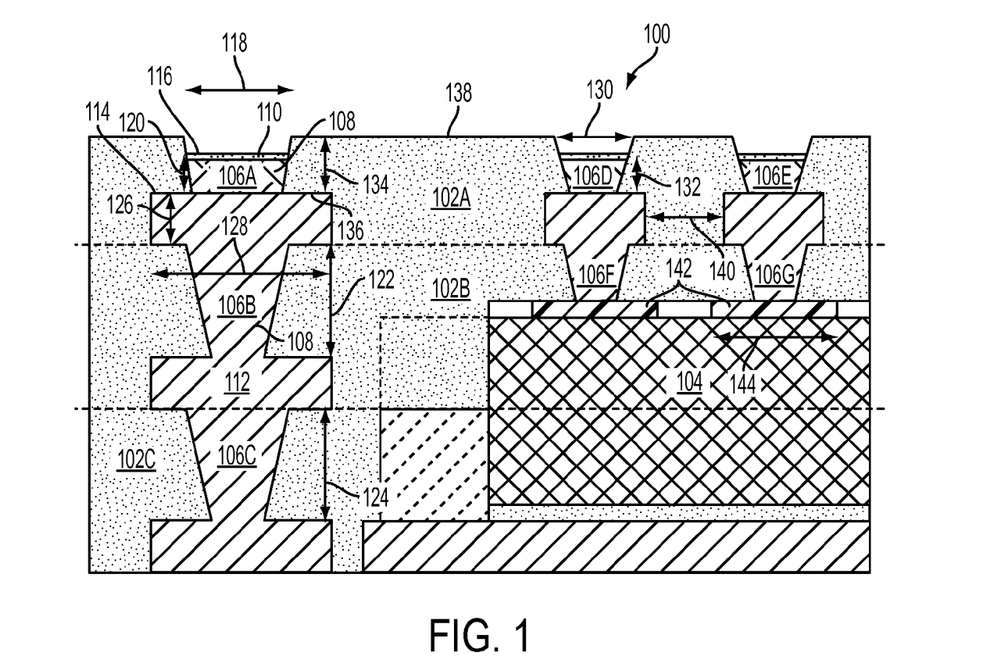
FIG. 1 shows a side view of an electronic package, in an example embodiment.

FIG. 1 shows a side view of an electronic package 100, in an example embodiment. The electronic package 100 may be a circuit board or electronic component onto which a silicon die may be coupled, such as to provide input/output to the silicon die.

The electronic package 100 includes package insulator layers 102A, 102B, 102C (generically "package insulator layer 102"). In various examples, the package insulator layer may be a buildup dielectric material or a solder resist. In an example, the buildup dielectric material is an Ajinomoto buildup film. The package insulator layer 102 may be substantially non-conductive and the various layers 102A, 102B, 102C may be formed in sequence and in separate steps, each insulator layer 102 being substantially planar.

The electronic package 100 further includes a silicon bridge 104 embedded in one of the package insulator layers 102C. The silicon bridge 104 may provide connectivity between various components such as multiple chips, including, but not limited to processor chips and memory chips, within or attached to the electronic package 100. In an example, the silicon bridge 104 is fabricated, at least in part, from silicon. In an example, the silicon bridge 104 is fabricated, at least in part, from a ceramic, such as alumina. In an example, the silicon bridge 104 is fabricated, at least in part, from one or more organic interposers, including an organic material.

Vias 106 embedded within the package insulator layers 102 may provide electrical connectivity vertically through the package insulator layers 102. In an example, a via 106 extends through one layer 102, with multiple vias 106 (e.g., vias 106A, 106B, 106C) stacking to extend through multiple layers 102A, 102B, 102C. Each via 106 includes a conductor 108. In various examples, some or all of the conductors 108 are comprised of nickel. Certain vias 106A, 106D, 106E, include a finish layer 110 configured to interface between the via 106 generally and an external electrical component, such as a solder ball, a pin, and the like. Vias that are internal to the electronic package 100 and which do not interface with an external electrical component optionally do not include the finish layer 110.

In various examples, the finish layer 110 is comprised of a gold-based compound. In an example, the gold-based compound is a palladium-gold compound. The compounds disclosed herein may be a heterogeneous mixture of materials or substantially homogeneous layers of such materials. In various alternative examples, the finish layer includes any of a variety of gold-based compounds and/or combinations, such as electroless nickel immersion gold (ENIG), ENIG plus electroless gold (ENIG+EG), and Nickel-Palladium-Gold (NiPdAu). Additionally or alternatively, the finish layer 110 may include or may be an alternative noble metal based layer. Additionally or alternatively, the finish layer 110 may include or may be an organic solderabiliy preservative (OSP). The gold-based compound may be relatively unsusceptible to corrosion, and/or electron migration, such as in comparison with copper, or other materials conventionally used in via construction.

In an example, the finish layer 110 may be formed form a layer of electroless plated palladium and a layer of electroless plated gold which together may form the gold compound. In an example, the palladium layer is coupled to the conductor 108 and the gold layer is coupled or couple-able to a solder ball or other connector. Example dimensions may include that the palladium layer is approximately forty (40) nanometers thick and the gold layer is approximately sixty (60) nanometers thick.

The via 106 may be formed in the layer 102 into which the via 106 is to be embedded, plating the nickel conductor, such as with an eletroless plating process, and then by applying the finish layer 110 on the top of the conductor 108. The vias 106 may provide connectivity between electrically conductive pads 112, the silicon bridge 104, and electronic components that may be coupled to the finish layers 110, among other potential destinations. Each conductor 108 includes a first end 114 proximate an electrically conductive pad 112 and a second end 116 to which the finish layer 110 is secured.

In various examples, the vias 106 with the finish layer 110, i.e., the vias 106A, 106D, 106E, include the conductor 108 comprised of a first material while other vias 106 may include a conductor comprised of a second material different from the first material. In various examples, the first material is nickel and the second material is copper. In various alternative examples any of a variety of suitable materials may be utilized between the first and second materials.

The electronic package 100 may be in any of a variety of suitable dimensions for a variety of purposes. In an example implementation, the vias 106A, 106B, 106C include conductors 108 having a top diameter 118 of forty-nine (49) micrometers. The conductors 108A, 108D, 108E have a height 120 of seven (7) micrometers while the conductors 108B, 108C have heights 122, 124 of twenty-seven (27) and twenty-five (25) micrometers, respectively. The pads 112 have a vertical thickness 126 of fifteen (15) micrometers and a horizontal width 128 of seventy-seven (77) micrometers. Other vias 106D, 106E have conductors 108 having a top diameter 130 of twenty-two (22) micrometers and a height 132 of seven (7) micrometers. In an example, the layer 102A has a thickness 134 of twelve (12) micrometers from a top 136 of the pad 108 to the exterior surface 138 of the electronic package 100. In an example, a separation 140 between pads 108 may be at least thirteen (13) micrometers. Pads 142 that optionally couple between the vias 106F, 106G and the silicon bridge 104 may have a width 144 of fifty (50) micrometers. The above dimensions are for example purposes only and are approximate based on circumstances and tolerances.

Figure 2:
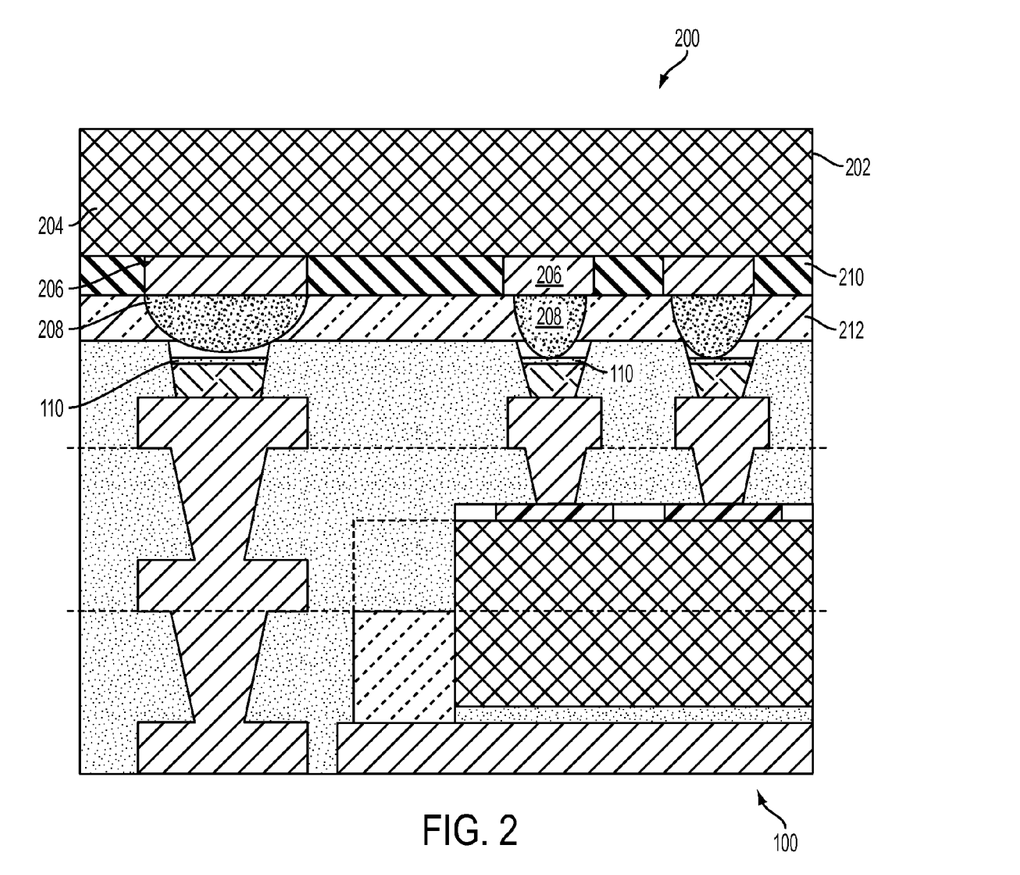
FIG. 2 shows an electronic assembly including a chip package soldered to an electronic package, in an example embodiment.

FIG. 2 shows an electronic assembly 200 including a chip package 202 soldered to the electronic package 100, in an example embodiment. The electronic assembly 200 illustrates an FLI architecture.

The chip package 202 includes a silicon die 204 and conductive pads 206, for instance made of copper, coupled to the silicon die 204. Solder balls 208 are or may be coupled to the conductive pads 206 and are coupleable to the finish layer 110 of the electronic package 100. It is noted that the electronic assembly 200 is not fully formed, as illustrated. Rather, once the solder balls 208 are coupled to the finish layers 110 the electronic assembly 200 may be fully assembled in the illustrated example.

In the illustrated example, the chip package 202 further includes a wafer-level underflow layer 210 surrounding the conductive pads 206 and a capillary underfill layer 212. Such layers 210, 212 may provide stability and insulation for the chip package 202. Such layers 210, 212 may be omitted or supplemented by other layers for the same or other purposes.

In an example where the electronic package 100 includes the example dimensions provided above, the pads 206 and the wafer-level underflow layer 210 may have a thickness of approximately sixteen (16) micrometers. The solder ball 208A and the capillary underfill layer 212 may have a thickness of from ten (10) to fifteen (15) micrometers. The solder balls 208B, 208C may have a thickness of approximately twenty (20) micrometers.

Figure 3:
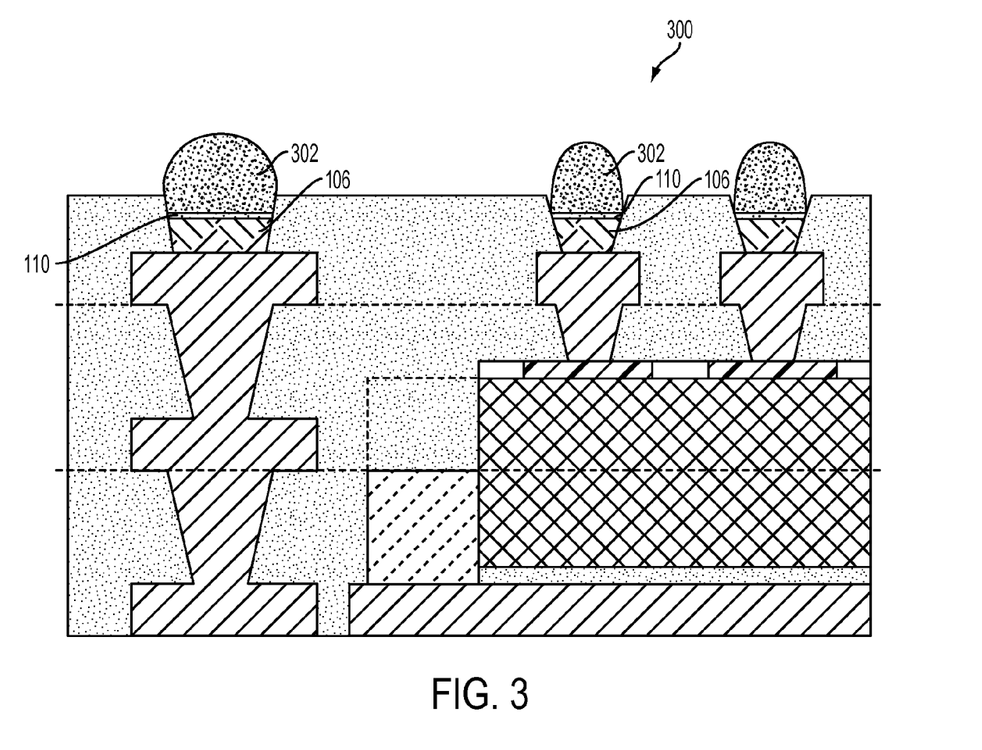
FIG. 3 shows an example of an electronic package, in an example embodiment.

FIG. 3 shows an example of an electronic package 300, in an example embodiment. The electronic package 300 may be the same or similar to that of the electronic package 100 and further include solder balls 302, such as paste printed solder, coupled to the finish layers 110 of the vias 106. Thus, the electronic package 300 may be fully configured to couple to a chip package, such as the chip package 202.

Figure 4:
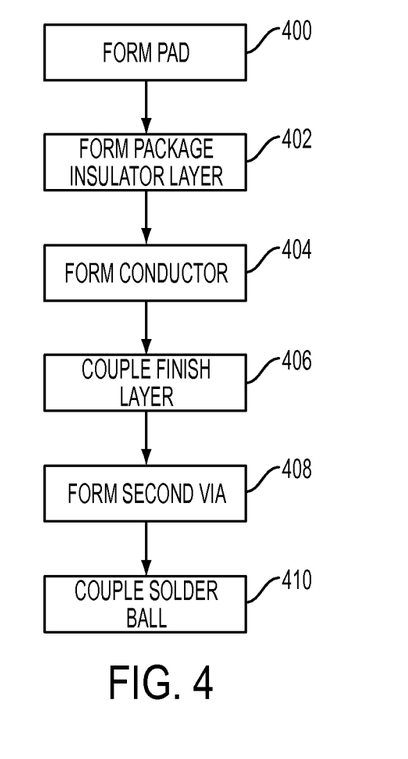
FIG. 4 is a flowchart for using a microelectronic assembly, in an example embodiment.

FIG. 4 is a flowchart for using a microelectronic assembly, in an example embodiment. The microelectronic assembly may be the microelectronic assembly 100 or may be any microelectronic assembly that includes a temperature sensor 102.

At operation 400, an electrically conductive pad is formed. In an example, the pad is coupled to a silicon bridge.

At operation 402, a package insulator layer including a substantially non-conductive material is formed, the package insulator layer being substantially planar. In an example, the package insulator layer comprises at least one of a buildup dielectric material and a solder resist. In an example, the buildup dielectric material is an Ajinomoto buildup film. In an example, the package insulator layer encloses, at least in part, the electrically conductive pad.

At operation 404, a conductor of a via is formed extending vertically through at least part of the package insulator layer and having a first end proximate the electrically conductive pad and a second end opposite the first end.

At operation 406, a finish layer of the via is coupled to the second end of the conductor, the finish layer including a palladium-gold compound.

At operation 408, a second via is formed electrically coupled between the via and the electrically conductive pad and enclosed, at least in part, by the package insulator layer. In an example, the conductor of the first via is comprised of a first material and the second via includes a conductor comprised of a second material different from the first material. In an example, the first material is nickel.

At operation 410, a solder ball is coupled to the finish layer. In an example, the solder is configured to be electrically coupled to a connector of a silicon die.

Figure 5:
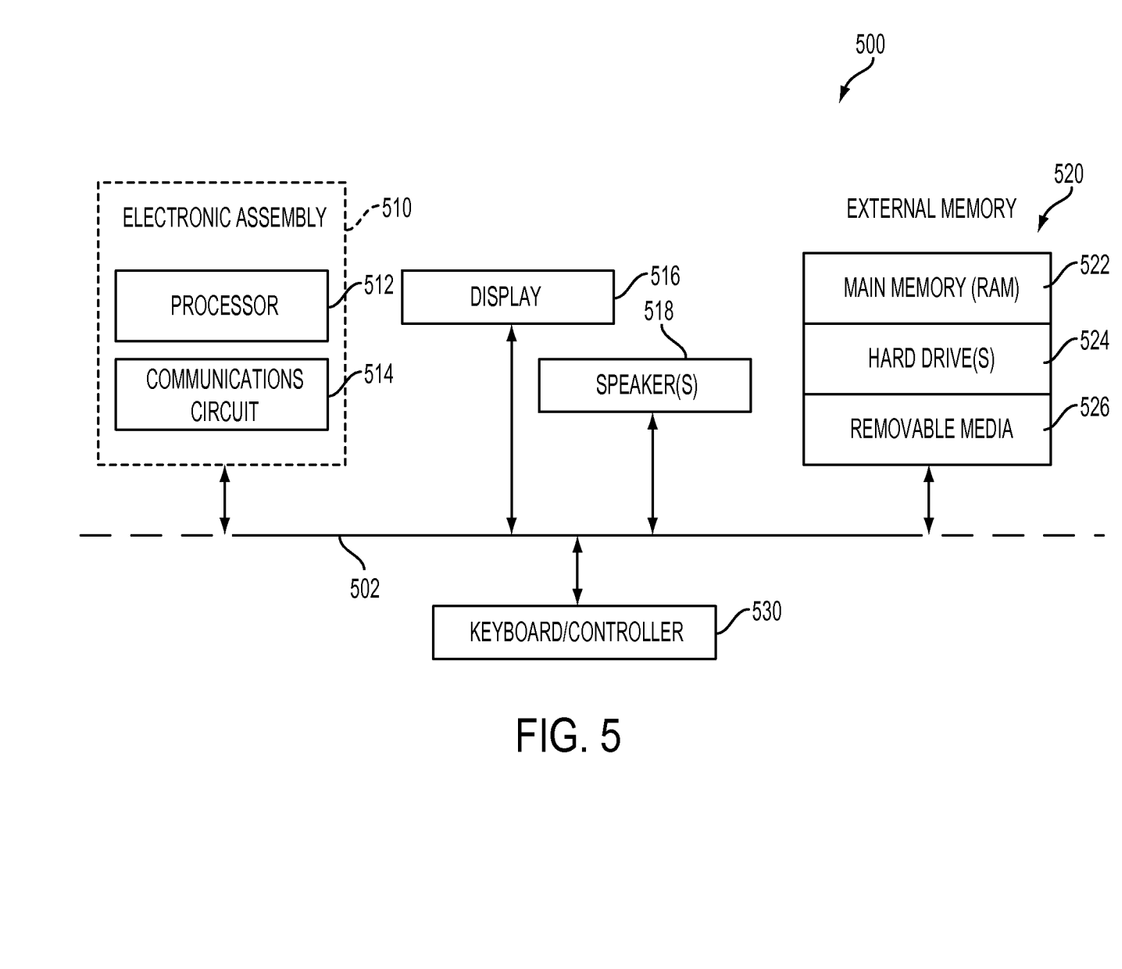
FIG. 5 is a block diagram of an electronic device incorporating at least one microelectronic assembly, in an example embodiment.

An example of an electronic device using electronic assemblies as described in the present disclosure is included to show an example of a higher level device application for the disclosed subject matter. FIG. 5 is a block diagram of an electronic device 500 incorporating at least one electronic assembly, such as an electronic package 100 or other electronic or microelectronic assembly related to examples herein. The electronic device 500 is merely one example of an electronic system in which embodiments of the present invention can be used. Examples of electronic devices 500 include, but are not limited to personal computers, tablet computers, mobile telephones, personal data assistants, MP3 or other digital music players, wearable devices, Internet of things (IOTS) devices, etc. In this example, the electronic device 500 comprises a data processing system that includes a system bus 502 to couple the various components of the system. The system bus 502 provides communications links among the various components of the electronic device 500 and can be implemented as a single bus, as a combination of busses, or in any other suitable manner.

An electronic assembly 510 is coupled to the system bus 502. The electronic assembly 510 can include any circuit or combination of circuits. In one embodiment, the electronic assembly 510 includes a processor 512 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in the electronic assembly 510 are a custom circuit, an application-specific integrated circuit (ASIC), or the like, such as, for example, one or more circuits (such as a communications circuit 514) for use in wireless devices like mobile telephones, pagers, personal data assistants, portable computers, two-way radios, and similar electronic systems. The IC can perform any other type of function.

The electronic device 500 can also include an external memory 520, which in turn can include one or more memory elements suitable to the particular application, such as a main memory 522 in the form of random access memory (RAM), one or more hard drives 524, and/or one or more drives that handle removable media 526 such as compact disks (CD), digital video disk (DVD), and the like.

The electronic device 500 can also include a display device 516, one or more speakers 518, and a keyboard and/or controller 530, which can include a mouse, trackconnection, touch screen, voice-recognition device, or any other device that permits a system user to input information into and receive information from the electronic device 500.

Additional Examples

Example 1 may include subject matter (such as an apparatus, a method, a means for performing acts) that can include an electrically conductive pad, a package insulator layer including a substantially non-conductive material, the package insulator layer being substantially planar, and a via, formed within the package insulator layer, electrically coupled to the electrically conductive pad, the via including a conductor extending vertically through at least part of the package insulator layer and having a first end proximate the electrically conductive pad and a second end opposite the first end and a finish layer secured to the second end of the conductor, the finish layer including a gold compound.

In Example 2, the electronic package of Example 1 optionally further includes that the gold compound is a palladium-gold compound.

In Example 3, the electronic package of any one or more of Examples 1 and 2 optionally further includes that the gold compound is one of electroless nickel immersion gold (ENIG), ENIG plus electroless gold (ENIG+EG), and Nickel-Palladium-Gold (NiPdAu).

In Example 4, the electronic package of any one or more of Examples 1-3 optionally further includes that the package insulator layer comprises at least one of a buildup dielectric material and a solder resist.

In Example 5, the electronic package of any one or more of Examples 1-4 optionally further includes that the buildup dielectric material is an Ajinomoto buildup film.

In Example 6, the electronic package of any one or more of Examples 1-5 optionally further includes that the package insulator layer encloses, at least in part, the electrically conductive pad.

In Example 7, the electronic package of any one or more of Examples 1-6 optionally further includes that the via is a first via and further comprising a second via electrically coupled between the via and the electrically conductive pad and enclosed, at least in part, by the package insulator layer.

In Example 8, the electronic package of any one or more of Examples 1-7 optionally further includes that the conductor of the first via is comprised of a first material and the second via includes a conductor comprised of a second material different from the first material.

In Example 9, the electronic package of any one or more of Examples 1-8 optionally further includes that the first material is nickel.

In Example 10, the electronic package of any one or more of Examples 1-9 optionally further includes a solder ball coupled to the finish layer.

In Example 11, the electronic package of any one or more of Examples 1-10 optionally further includes that the solder is configured to be electrically coupled to a connector of a silicon die.

In Example 12, the electronic package of any one or more of Examples 1-11 optionally further includes that the pad is coupled to a silicon bridge.

In Example 13, the electronic package of any one or more of Examples 1-12 optionally further includes that the silicon bridge is fabricated from at least one of silicon, ceramic, and an organic interposer.

Example 14 may include subject matter (such as an apparatus, a method, a means for performing acts) that can include forming an electrically conductive pad, forming a package insulator layer including a substantially non-conductive material, the package insulator layer being substantially planar, forming a conductor of a via extending vertically through at least part of the package insulator layer and having a first end proximate the electrically conductive pad and a second end opposite the first end, and coupling a finish layer of the via to the second end of the conductor, the finish layer including a palladium-gold compound.

In Example 15, the method of Example 14 optionally further includes that the gold compound is a palladium-gold compound.

In Example 16, the method of any one or more of Examples 14 and 15 optionally further includes that the gold compound is one of electroless nickel immersion gold (ENIG), ENIG plus electroless gold (ENIG+EG), and Nickel-Palladium-Gold (NiPdAu).

In Example 17, the method of any one or more of Examples 14-16 optionally further includes that the package insulator layer comprises at least one of a buildup dielectric material and a solder resist.

In Example 18, the method of any one or more of Examples 14-17 optionally further includes that the buildup dielectric material is an Ajinomoto buildup film.

In Example 19, the method of any one or more of Examples 14-18 optionally further includes that the package insulator layer encloses, at least in part, the electrically conductive pad.

In Example 20, the method of any one or more of Examples 14-19 optionally further includes that the via is a first via and further comprising forming a second via electrically coupled between the via and the electrically conductive pad and enclosed, at least in part, by the package insulator layer.

In Example 21, the method of any one or more of Examples 14-20 optionally further includes that the conductor of the first via is comprised of a first material and the second via includes a conductor comprised of a second material different from the first material.

In Example 22, the method of any one or more of Examples 14-21 optionally further includes that the first material is nickel.

In Example 23, the method of any one or more of Examples 14-22 optionally further includes a solder ball coupled to the finish layer.

In Example 24, the method of any one or more of Examples 14-23 optionally further includes that the solder is configured to be electrically coupled to a connector of a silicon die.

In Example 25, the method of any one or more of Examples 14-24 optionally further includes that the pad is coupled to a silicon bridge.

In Example 26, the method of any one or more of Examples 14-25 optionally further includes fabricating the silicon bridge from at least one of silicon, ceramic, and an organic interposer Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electronic package, comprising:
   an electrically conductive pad;
   a first package insulator layer including a substantially non-conductive material; and
   a first via, formed within the package insulator layer, electrically coupled to a front side of the electrically conductive pad, the first via comprising:
   a nickel conductor extending vertically through at least part of the package insulator layer and having a first end coupled to the electrically conductive pad and a second end opposite the first end;
   a finish layer coupled to the second end of the conductor, the finish layer including a gold compound
   an embedded bridge within the electronic package;
   a second package insulator layer between a backside of the electrically conductive pad and the embedded bridge; and
   a copper via formed through the second package insulator layer, and coupled between the backside of the electrically conductive pad and the embedded bridge.

2. The electronic package of claim 1, wherein the gold compound is a palladium-gold compound.

3. The electronic package of claim 1, wherein the gold compound is one of electroless nickel immersion gold (ENIG), ENIG plus electroless gold (ENIG+EG), and Nickel-Palladium-Gold (NiPdAu).

4. The electronic package of claim 1, wherein the first package insulator layer comprises at least one of a buildup dielectric material and a solder resist.

5. The electronic package of claim 4, wherein the buildup dielectric material is an Ajinomoto buildup film.

6. The electronic package of claim 1, wherein the first package insulator layer encloses, at least in part, the electrically conductive pad.

7. The electronic package of claim 1, further comprising a solder ball coupled to the finish layer.

8. The electronic package of claim 7, wherein the solder is configured to be electrically coupled to a connector of a silicon die.

9. The electronic package of claim 1, wherein the embedded bridge is a silicon bridge.

10. A method of making an electronic package, comprising:
    forming an electrically conductive pad;
    forming a first package insulator layer including a substantially non-conductive material;
    forming a first nickel via extending vertically through at least part of the first package insulator layer and having a first end coupled to the electrically conductive pad and a second end opposite the first end; and
    coupling a finish layer to the second end of the first nickel via, the finish layer including a gold compound;
    embedding a bridge within the electronic package;

forming a second package insulator layer between a backside of the electrically conductive pad and the bridge; and forming a copper via through the second package insulator layer, and coupled between the backside of the electrically conductive pad and the bridge.

11. The method of claim 10, wherein the gold compound is a palladium-gold compound.

12. The method of claim 10, wherein the gold compound is one of electroless nickel immersion gold (ENIG), ENIG plus electroless gold (ENIG+EG), and Nickel-Palladium-Gold (NiPdAu).

13. The method of claim 10, wherein the first package insulator layer comprises at least one of a buildup dielectric material and a solder resist.

14. The method of claim 13, wherein the buildup dielectric material is an Ajinomoto buildup film.

15. The method of claim 10, wherein the first package insulator layer encloses, at least in part, the electrically conductive pad.

16. The method of claim 10, further comprising coupling a solder ball to the finish layer.

17. The method of claim 16, wherein the solder is configured to be electrically coupled to a connector of a silicon die.

18. The method of claim 10, wherein embedding the bridge includes embedding a silicon bridge.

* * * * *

UNITED STATES PATENT AND TRADEMARK OFFICE
CERTIFICATE OF CORRECTION

PATENT NO. : 9,603,247 B2  
APPLICATION NO. : 14/456606  
DATED : March 21, 2017  
INVENTOR(S) : Swaminathan et al.

Page 1 of 1

It is certified that error appears in the above-identified patent and that said Letters Patent is hereby corrected as shown below:

On the Title Page

On page 2, in Column 2, under "Other Publications", Line 10, delete "ailed" and insert --mailed-- therefor In the Claims In Column 8, Line 27, in Claim 1, delete "compound" and insert --compound;-- therefor Signed and Sealed this  
Fourth Day of June, 2019

Andrei Iancu  
*Director of the United States Patent and Trademark Office*